(12) United States Patent
Lu et al.

(10) Patent No.: US 8,356,262 B1
(45) Date of Patent: Jan. 15, 2013

(54) CELL ARCHITECTURE AND METHOD

(75) Inventors: Lee-Chung Lu, Taipei (TW); Li-Chun Tien, Tainan (TW); Shyue-Shyh Lin, Zhubei (TW); Zhe-Wei Jiang, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 13/207,506

(22) Filed: Aug. 11, 2011

Related U.S. Application Data (60) Provisional application No. 61/499,841, filed on Jun. 22, 2011.

(51) Int. Cl.
*G06F 17/50* (2006.01)
*H01L 29/40* (2006.01)
*H01L 23/48* (2006.01)
*H01L 23/52* (2006.01)
*H01L 21/44* (2006.01)

(52) U.S. Cl. ............................ 716/55; 257/774; 438/667

(58) Field of Classification Search .................... 716/55; 257/774; 438/667
See application file for complete search history.

(56) References Cited

U.S. PATENT DOCUMENTS

| | | | | |
|---|---|---|---|---|
| 7,709,275 B2 * | 5/2010 | Yang et al. | ........................ | 438/3 |
| 2011/0312163 A1 * | 12/2011 | Romano et al. | ................ | 438/478 |
| 2012/0104569 A1 * | 5/2012 | Chen | ............................ | 257/659 |

* cited by examiner

*Primary Examiner* — Suresh Memula
(74) *Attorney, Agent, or Firm* — Duane Morris LLP (57) ABSTRACT

A method includes selecting a cell stored in a non-transient computer readable storage medium, arranging a plurality of the cells on a model of a semiconductor device, and creating a mask for the semiconductor device based on the model of the semiconductor device. The cell is designed according to a design rule in which a first power-supply-connection via satisfies a criterion from the group consisting of: i) the first power-supply-connection via is spaced apart from a second power-supply-connection via by a distance that is greater than a threshold distance such that the cell can be fabricated by a single-photolithography single-etch process, or ii) the first power-supply-connection via is coupled to first and second substantially parallel conductive lines that extend along directly adjacent tracks.

21 Claims, 8 Drawing Sheets

CELL ARCHITECTURE AND METHOD

CROSS-REFERENCE TO RELATED APPLICATIONS

This application claims priority to U.S. Patent Application No. 61/499,841, filed Jun. 22, 2011, the entirety of which is herein incorporated by reference.

FIELD OF DISCLOSURE

The disclosed system and method relate to semiconductors. More particularly, the disclosed system and method relate to circuit design and layout on semiconductor substrates.

BACKGROUND

The size of semiconductor devices continues to shrink as the ability to create smaller patterns on semiconductor substrates continues to improve. In a photolithographic process, for a given wavelength of light, there is a minimum line spacing to produce clean lines with a single photomask. 2P2E processes (Processes using two photolithography steps and two etch steps) may be used to create smaller semiconductor devices by using two patterning steps for forming patterns in the same layer. 2P2E processes use two photomasks and two etching steps to separately form respectively different patterns in a single photoresist layer, using a relatively larger line pitch during each of the individual patterning steps. 2P2E processes generally include two additional steps compared to semiconductor fabrication processes that use a single photolithography step and a single etch step, i.e., one-photo, one-etch (1P1E) processes.

DETAILED DESCRIPTION

Systems and methods are disclosed that enable a circuit to be fabricated on a semiconductor substrate using a single-photolithography step and a single-etch (1P1E) step for forming vertical vias for connecting to power supplies ("power-supply-connection vias"). These disclosed systems and methods advantageously enable the number of processing steps for forming power-supply-connection vias to be reduced, which also reduces the processing time and production cost for circuit fabrication.

One or more power-supply-connection vias are arranged in a cell according to at least one design rule that enables the one or more power-supply-connection vias to be fabricated by a 1P1E process. The design rule provides that a first power-supply-connection via is to be spaced apart from a second power-supply-connection via by a distance that is greater than a threshold distance that enables the first and second power-supply-connection vias to be fabricated by a 1P1E process (regardless of whether pairs of the cells are placed adjacent to each other, horizontally or vertically), or the first power-supply-connection via is to be coupled to first and second substantially parallel conductive lines that extend along directly adjacent tracks that are defined in the cell. In order to ensure that the first power-supply-connection via is to be spaced apart from a second power-supply-connection via by a distance that is greater than a threshold distance that enables the first and second power-supply-connection vias to be fabricated by a 1P1E process, a pair of power-supply-connection vias may have the same y-coordinate at the cell boundary and be spaced apart in an x-direction by locating the two power-supply-connection vias on alternating tracks (e.g., in one embodiment only odd numbered tracks, or in another embodiment only on even numbered tracks).

Alternatively, in another embodiment, the pair of power-supply-connection vias may be located in adjacent tracks, but not all at the cell boundary, The power-supply-connection vias in adjacent tracks have differing y-coordinates such that the distance between the power-supply-connection vias is at least the minimum distance allowed in a 1P1E process (regardless of whether pairs of the cells are placed adjacent to each other, horizontally or vertically). For example, the even numbered tracks may have power-supply connection vias at the cell boundary, while the odd numbered tracks have power-supply connection vias shifted toward the cell interior. Thus the power-supply connection vias in the odd numbered tracks are always sufficiently far from the power-supply connection vias in the odd and even numbered tracks to allow a 1P1E process to form the odd and even tracks.

An improved method 100 for fabricating a circuit on a semiconductor substrate is described with reference to FIG. 1, which is a flow diagram of the method. Method 100 may be entirely or partially performed by a system, such as system 200 illustrated in FIG. 2. System 200 includes an electronic design automation ("EDA") tool 210 such as "IC COMPILER"™, sold by Synopsys, Inc. of Mountain View, Calif., having a router 220 such as "ZROUTE"™, also sold by Synopsys. Other EDA tools 210 may be used, such as, for example, the "VIRTUOSO" custom design platform or the Cadence "ENCOUNTER"® digital IC design platform along with the "VIRTUOSO" chip assembly router 220, all sold by Cadence Design Systems, Inc. of San Jose, Calif.

Figure 2:
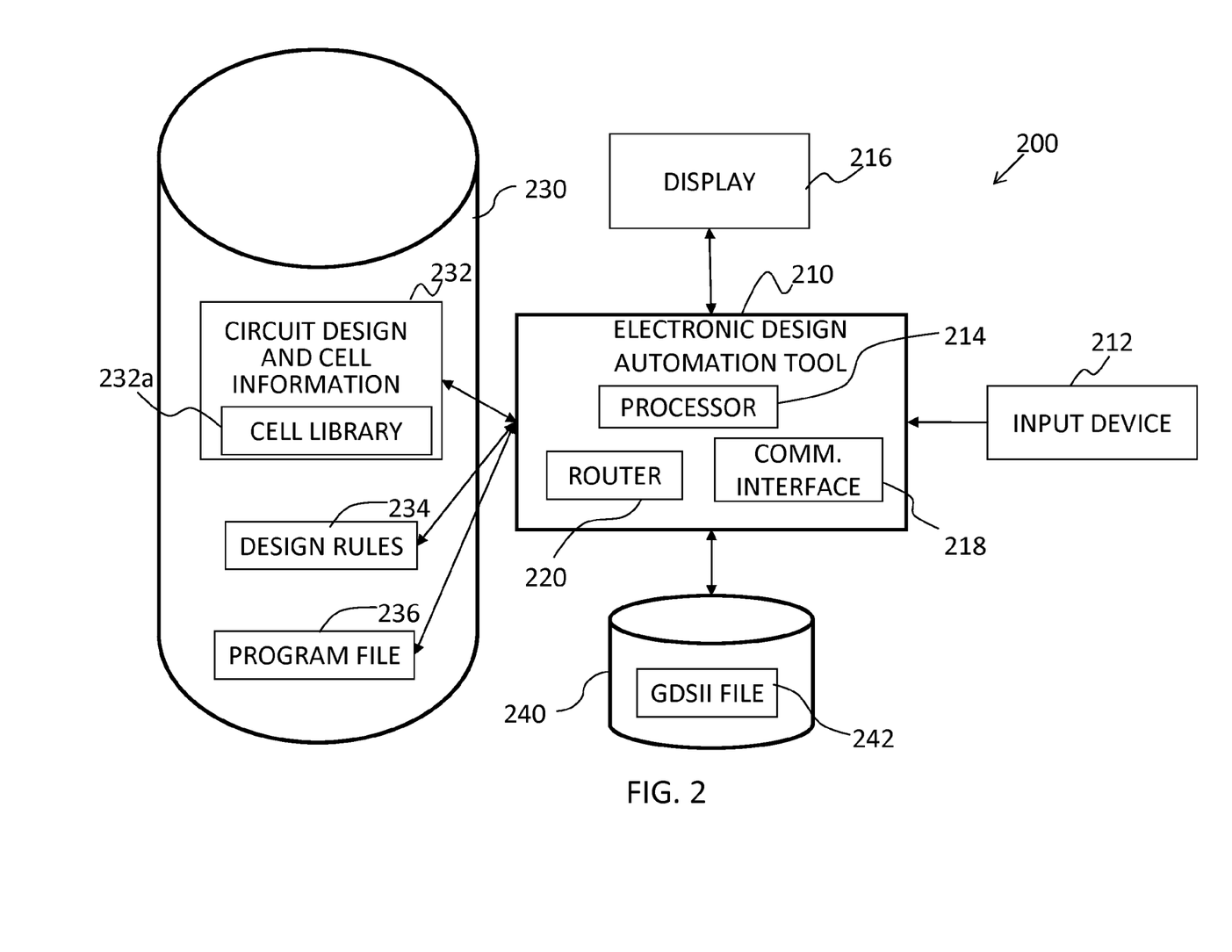
FIG. 2 is a block diagram of one example of a system configured to perform some or all of the method set forth in FIG. 1.

The EDA tool 210 is a special purpose computer formed by retrieving stored program instructions 236 from a computer readable storage medium 230, 240 and executing the instructions on a general purpose processor 214. Processor 214 may be any central processing unit (CPU), microprocessor, microcontroller, or computational device or circuit for executing instructions. The non-transient machine readable storage medium 230, 240 may be a flash memory, random access memory ("RAM"), read only memory ("ROM"), or other storage medium. Examples of RAMs include, but are not limited to, static RAM ("SRAM") and dynamic RAM ("DRAM"). ROMs include, but are not limited to, programmable ROM ("PROM"), electrically programmable ROM ("EPROM"), and electrically erasable programmable ROM ("EEPROM"), to name a few possibilities.

System 200 may include a display 216 and a user interface or input device 212 such as, for example, a mouse, a touch screen, a microphone, a trackball, a keyboard, or other device through which a user may input design and layout instructions to system 200. The one or more computer readable storage mediums 230, 240 may store data input by a user such as a circuit design and cell information 232, which may include a cell library 232a, design rules 234, one or more program files 236, and one or more graphical data system ("GDS") II files 242.

EDA tool 210 may also include a communication interface 218 allowing software and data to be transferred between EDA tool 210 and external devices. Examples of a communications interface 218 include, but are not limited to, a modem, an Ethernet card, a wireless network card, a Personal Computer Memory Card International Association ("PCM-CIA") slot and card, or the like. Software and data transferred via communications interface 218 may be in the form of signals, which may be electronic, electromagnetic, optical, or the like that are capable of being received by communications interface 218. These signals may be provided to communications interface 218 via a communications path (e.g., a channel), which may be implemented using wire, cable, fiber optics, a telephone line, a cellular link, a radio frequency ("RF") link and other communication channels.

Router 220 is capable of receiving an identification of a plurality of cells to be included in a circuit layout, including a list 232 of pairs of cells, selected from the cell library 232a, within the plurality of cells to be connected to each other. Design rules 234 may be used for a variety of processing technologies (e.g., technology greater than, less than, or equal to 32 nm). In some embodiments, the design rules 234 configure the router 220 to locate connecting lines and vias on a manufacturing grid. Other embodiments may allow the router to include off-grid connecting lines and/or vias in the layout.

Figure 3A:
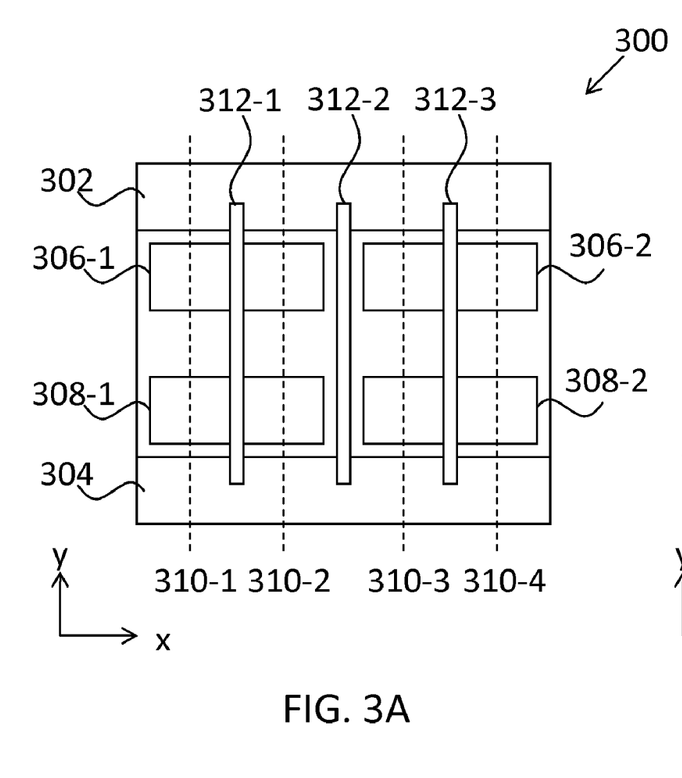
FIGS. 3A and 3B illustrate tracks and vias formed laid out on a cell.

Referring again to FIG. 1, a plurality of tracks along which power-supply-connection vias are to be disposed are identified on a semiconductor substrate at block 102. For example, FIG. 3A illustrates a cell 300 including a first power supply line 302 separated from a second power supply line 304. Doped regions 306-1 and 306-2 ("doped regions 306") and 308-1 and 308-2 ("doped regions 308") are disposed between power supply lines 302 and 304. As will be understood by one skilled in the art, doped regions 306, 308 may include n-type and/or p-type dopants for forming active areas in a semiconductor substrate. A plurality of tracks 310-1, 310-2, 310-3, and 310-4 ("tracks 310") along which power-supply-connection vias are to be formed are identified over the semiconductor substrate extending parallel to and between polysilicon layers 312. Polysilicon layers 312 may be polysilicon gates of one or more transistors formed over the doped regions 306, 308.

In some embodiments, the perpendicular distance between adjacent tracks is smaller than a permissible distance between adjacent vias in a single mask (1P1E) process for the particular technology node used. Nevertheless, using techniques described herein, a 1P1E process can still be used.

Figure 3B:
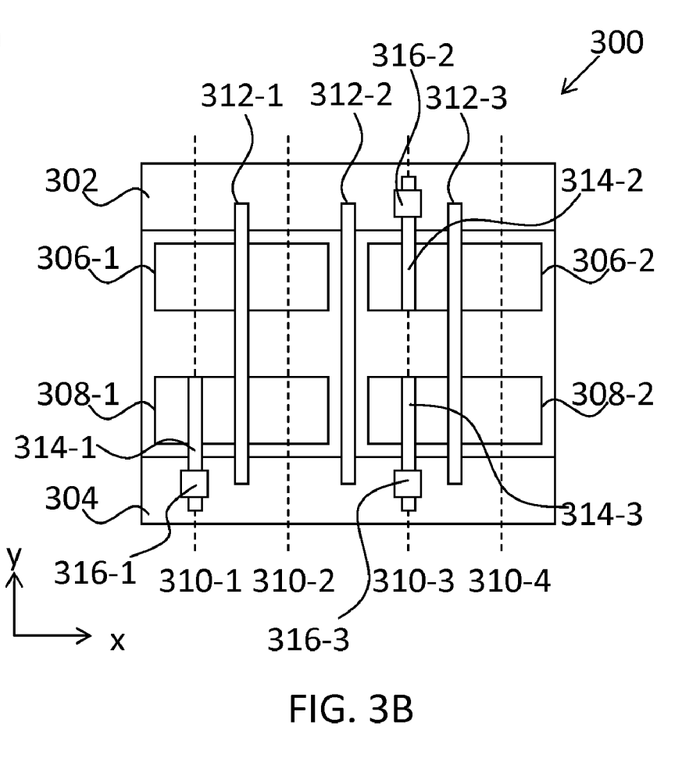

At block 104, power-supply-connection vias are placed on select tracks 310 over a power supply line according to a design rule. In some embodiments, a design rule may provide that power-supply-connection vias 316 at the cell boundary are not to be disposed along immediately adjacent tracks along which metal or conductive lines 314-1, 314-2, and 314-3 ("conductive lines 314") may also extend. For example, for power-supply-connection vias having the same y-coordinate may be disposed on even tracks, but not on odd tracks, or power-supply-connection vias having the same y-coordinate may be disposed on odd tracks, but not on even tracks. The conductive lines 314 extend in substantially planar x- and y-directions and are coupled to a supply line 302, 304 by a power-supply-connection via that extends perpendicular to the planar x- and y-directions (i.e., the z-direction). FIG. 3B illustrates one example of a cell in which power-supply-connection vias are constrained such that they are not disposed along immediately adjacent tracks 210. As shown in FIG. 3B, conductive line 314-1 is disposed along track 310-1 and extends from power supply line 304 to doped region 308-1. Conductive line 314-1 is coupled to power supply line 304 by power-supply-connection via 316-1, which extends perpendicular to the plane in which conductive lines 314 and supply lines 302 and 304 extend through layers of the semiconductor substrate. Conductive lines 314-2 and 314-3 extend along track 310-3. Conductive line 314-2 is coupled to supply line 302 by power-supply-connection via 316-2, and conductive line 314-3 is coupled to supply line 304 by power-supply-connection via 316-3. Accordingly, the design rule may provide that at least one "empty" track, i.e., a track along which a power-supply-connection via is not disposed, is located between tracks along which power-supply-connection vias are disposed with the same or approximately the same y-coordinates.

Figure 4:
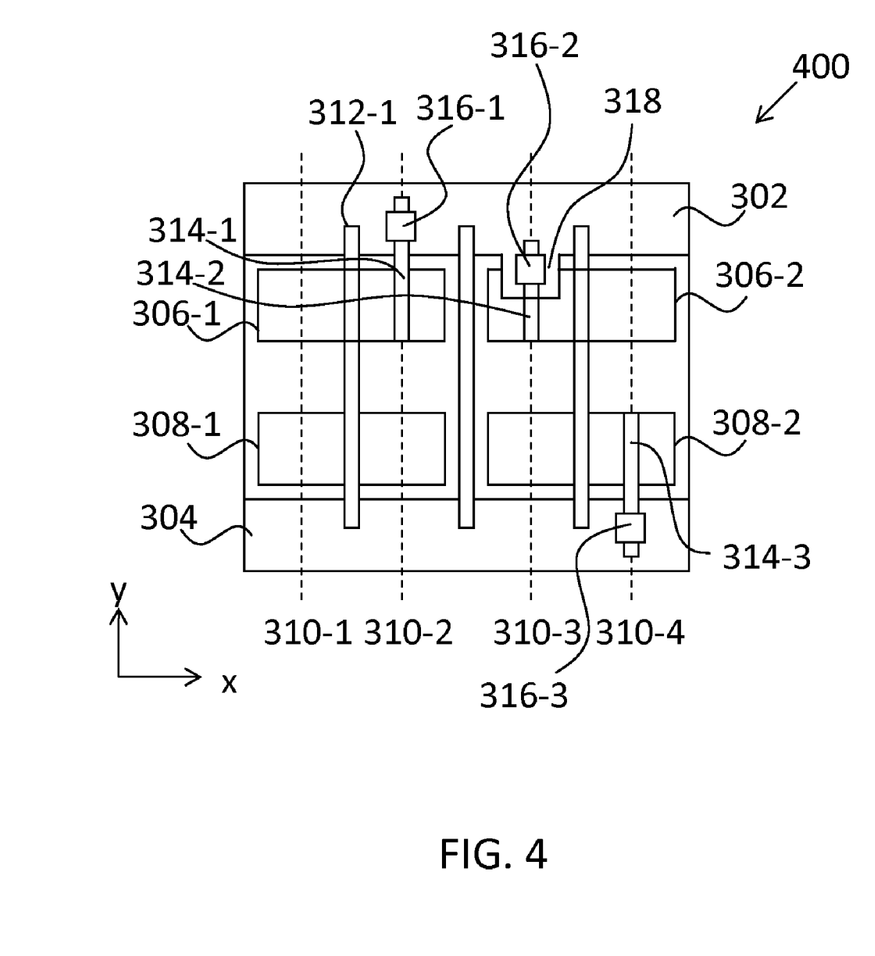
FIG. 4 illustrates a cell includes vias extending along immediately adjacent tracks.

In some embodiments, a design rule may provide for power-supply-connection vias to be disposed along directly adjacent tracks, e.g., tracks 310-1 and 310-2, but are shifted such that power-supply-connection vias in immediately adjacent tracks do not have the same y-coordinate. Two power-supply-connection vias can be aligned on the same track (i.e., same x-coordinate) as each other, so long as they are spaced sufficiently far apart from each other to satisfy the minimum separation for a single mask ("1P1E") process. For example, FIG. 4 illustrates a cell 400 in which conductive lines 314 are respectively coupled to supply line 302 by power-supply-connection vias 316-1 and 316-2 and are disposed on immediately adjacent tracks 310, e.g., tracks 310-1 and 310-2. As shown in FIG. 4, power-supply-connection via 316-2 is disposed over an extension 318 of supply line 302 such that power-supply-connection via 316-2 is not aligned with power-supply-connection via 316-1 in the x- or y-directions (i.e., power-supply-connection via 316-2 has different x- and y-coordinates from power-supply-connection via 316-1). Extension 318 extends from power supply line 302 towards the interior of the cell 400 and power-supply-connection via 316-2 is disposed over extension 318 such that it is shifted in the y-direction towards the interior of the cell with respect to power-supply-connection via 316-1.

Figure 5A:
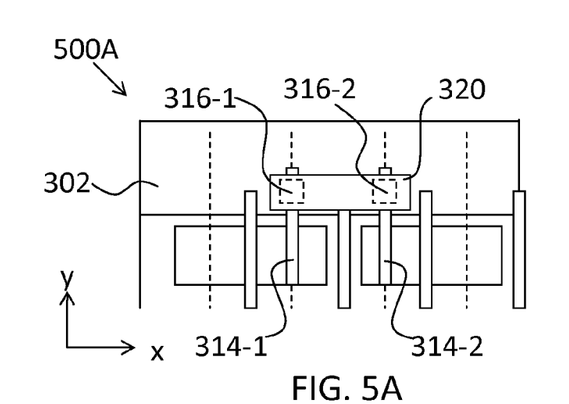
FIGS. 5A-5D illustrate embodiments in which vertical vias are merged to connect vias extending in immediately adjacent tracks to supply lines.

In some embodiments, a design rule may provide for conductive lines to extend along directly adjacent tracks and be coupled together by merging adjacent power-supply-connection vias to form a single elongated horizontal power-supply-connection via which spans the two tracks. For example, FIGS. 5A-5D illustrate various embodiments of such a design rule. Referring first to FIG. 5A, conductive lines 314-1 and 314-2 respectively extend along tracks 310-1 and 310-2 and are connected to each other and to supply line 302 at power-supply-connection via 320, which is formed by merging power-supply-connection vias 316-1 and 316-2.

Figure 5B:
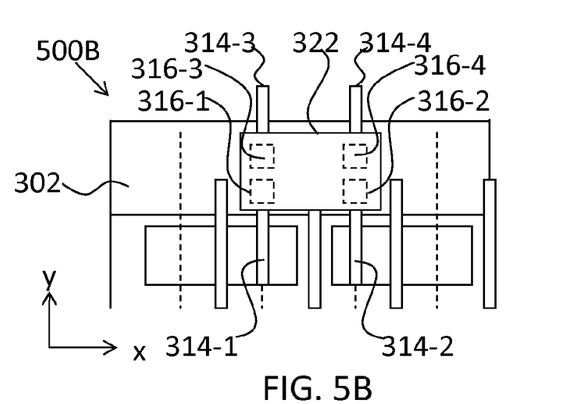

FIG. 5B illustrates an embodiment in which conductive lines 314-1, 314-2, 314-3, and 314-4 are coupled to supply line 302 at power-supply-connection via 322. According to this design rule, a pair of power-supply-connection vias which have the same y-coordinate, and are coupled to a common conductor are merged together to form a single elongated via as shown in FIG. 5A. The elongated via 322 may have an area that is greater than a combined area of power-supply-connection vias 316-1:316-4, which are merged into via 322.

Figure 5C:
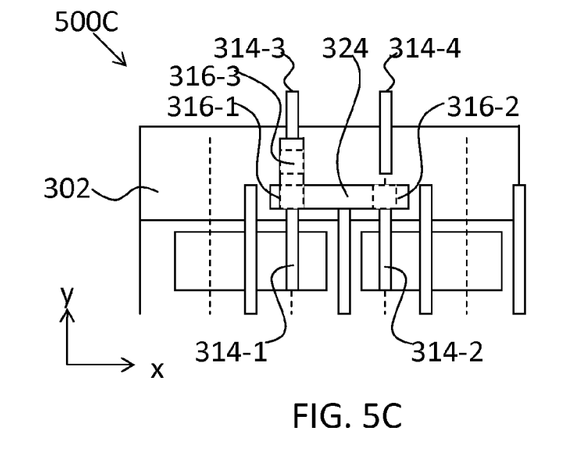
Figure 5D:
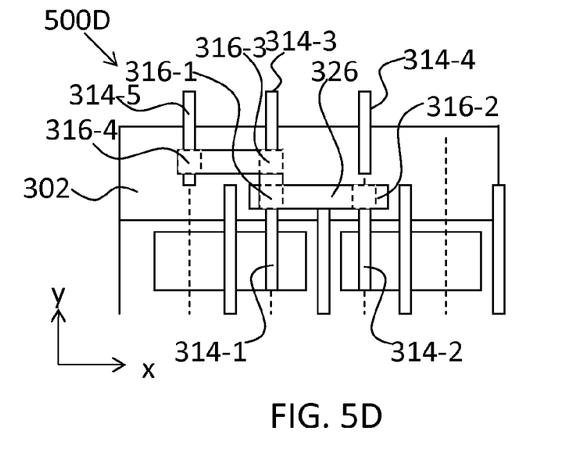

FIG. 5C illustrates another embodiment in which conductive lines 314-1, 314-2, and 314-3 are coupled together by power-supply-connection via 324 that is formed by merging power-supply-connection vias 316-1, 316-2, and 316-3. FIG. 5D illustrates an embodiment in which conductive lines 314-1, 314-2, 314-3, and 314-5 are coupled together by power-supply-connection via 326, which is formed by merging power-supply-connection vias 316-1:316-4.

Figure 6A:
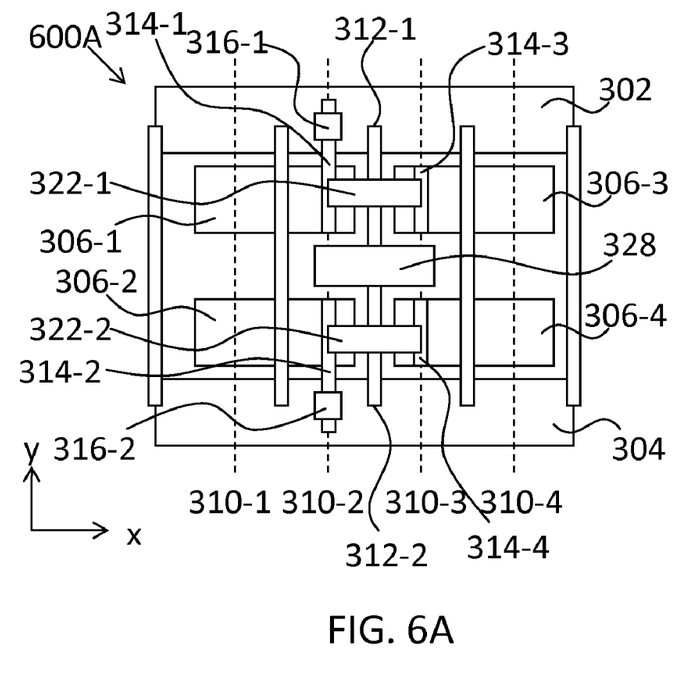
FIGS. 6A and 6B illustrate embodiments in which conductive layers are used to connect vias that extend between source and active regions.
Figure 6B:
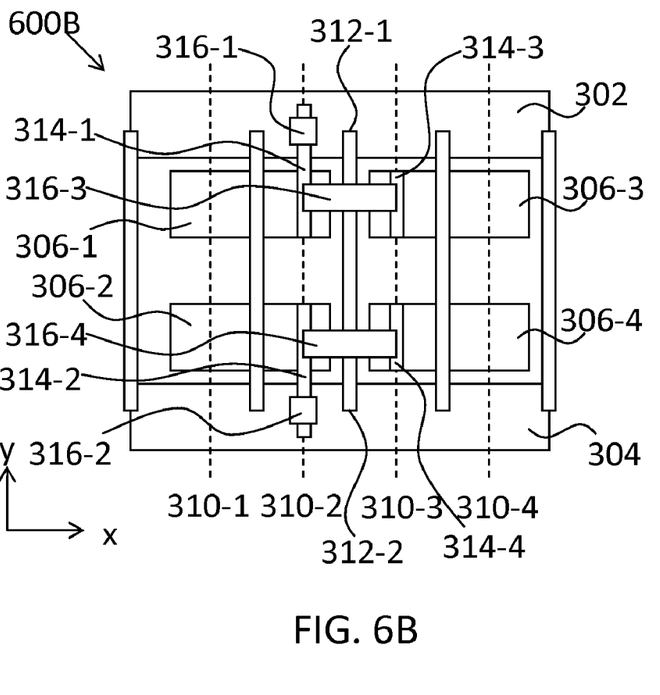

In some embodiments, a design rule may couple together vias and conductive lines that extend along directly adjacent tracks to form a single power-supply-connection via disposed between supply lines. For example, FIGS. 6A and 6B illustrate various embodiments of such a design rule. Referring first to FIG. 6A, cell 500A includes conductive lines 314-1 and 314-3 that respectively extend between supply line 302 and active areas 306-1 and 306-3, and conductive lines 314-3 and 314-3 that respectively extend between supply line 304 and active areas 306-3 and 306-4. Another conductive layer 322-1, e.g., a metal zero layer, M0, extends between and is electrically connected to conductive lines 314-1 and 314-3, which are coupled to supply line 302 at power-supply-connection via 316-1. Similarly, a conductive layer 322-2 extends between and is electrically connected to conductive lines 314-2 and 314-4, which are coupled to supply line 304 at a single power-supply-connection via 316-2. As will be understood by one skilled in the art, lines 314 and conductive layer 322 may be disposed in different layers. A cut poly layer 328 is used to isolate line 314-1 from conductive line 314-2, conductive line 314-3 from conductive line 314-4, and polysilicon layer 312-1 from polysilicon layer 312-2.

FIG. 6B illustrates an embodiment in which a via 316-3 connects conductive line 314-1 to conductive line 314-3, which respectively extend along immediately adjacent tracks 310-2 and 310-3 and are connected to supply line 302 at vertical via 316-1. Similarly, via 316-4 connects line 314-2 to line 314-4, which respectively extend along immediately adjacent tracks 310-2 and 310-3 and are connected to supply line 304 by power-supply-connection via 316-2.

Reference is again made to FIG. 1. At block 106, another design rule may be applied for developing two or more cell splits (i.e., two complementary cell designs) such that cells may be disposed adjacent to each other with a minimal amount of space between adjacent cells. For example, a first cell split may start at an even or odd track and a second cell starts at the opposite track type of the track type with which the first cell starts (i.e., odd or even track), and the at-cell-boundary power-supply-connection vias is allowed to be on odd tracks for both cells splits.

Figure 7:
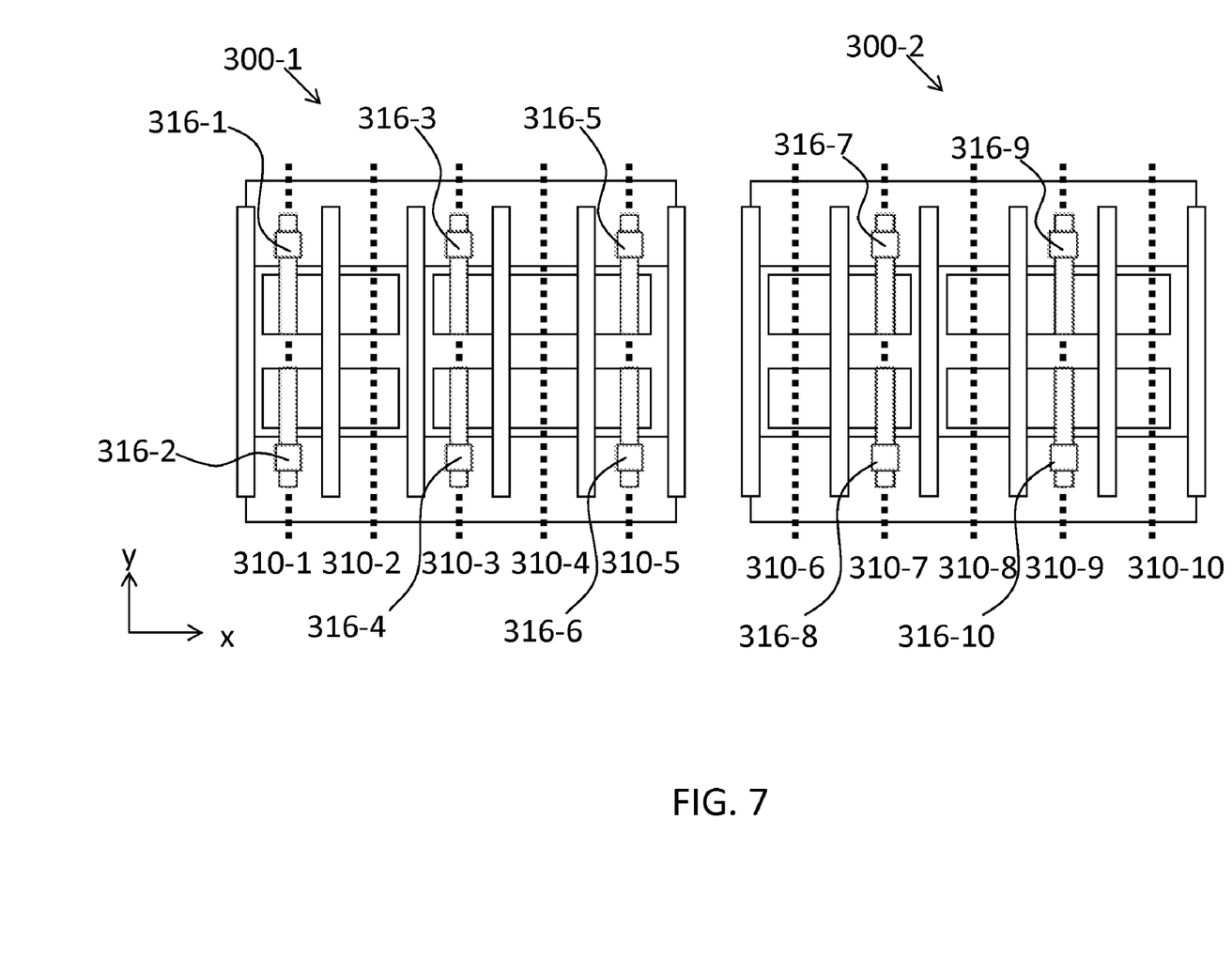
FIG. 7 illustrates an example of a pair of cell splits in accordance with a design rule.

In some embodiments, such as the embodiment illustrated in FIG. 7, both tracks that extend along the cell boundary in one cell split may include power-supply-connection vias and a second cell split does not include power-supply-connection vias in the tracks disposed along the cell boundaries. As shown in FIG. 7, odd tracks 310-1, 310-3, and 310-5 of cell 300-1 include power-supply-connection vias 316-1, 316-2, 316-3, 316-4, 316-5, and 316-6 disposed along their length, and tracks 310-1 and 310-5 are outermost tracks that extend along the cell boundaries. Odd tracks 310-7 and 310-9 of cell 300-2 also include power-supply-connection vias 316-7, 316-8, 316-9, and 316-10 along their lengths, but cell 300-2 has even tracks 310-6 and 310-10 as its outermost tracks that extend along the cell boundaries. Accordingly, cells 300-1 and 300-2 may be placed in close abutment to minimize the space between adjacent cells.

At block 108, the cell design data may be saved to a non-transient computer readable storage medium 230, 240 in a cell library 232a. The cell data are stored in cell library 232a are designed in accordance with one or more of the design rules described above enabling power-supply-connection vias to be fabricated using a 1P1E process.

For example, cells stored in cell library 232a may include at least one cell in which power-supply-connection vias are disposed in tracks that are not directly adjacent to one another such that at least one track along which a power-supply-connection via is not disposed is located between two tracks along which power-supply-connection vias are disposed. In some embodiments, cell library 232a includes at least two cells or cell splits each having power-supply-connection vias that are disposed along alternating non-directly-adjacent tracks (i.e., even or odd tracks). One or more cell designs may be stored in cell library 232a in which power-supply-connection vias are disposed along directly adjacent tracks, but are shifted (offset) from each other in the y-direction, such that the power-supply-connection vias in the directly adjacent tracks are not aligned in the x- and y-directions (i.e., they have different x-coordinates and different y-coordinates). The y-offset between power-supply-connection vias in adjacent tracks is sufficiently large that the distance between vias in two adjacent tracks is at least the minimum distance between adjacent vias in a 1P1E process for the technology being used. One or more cell designs may be stored in cell library 232a in which conductive lines extend along directly adjacent tracks and are coupled together by a power-supply-connection via that is formed by merging multiple vias into a single power-supply-connection via. One or more cell designs stored in cell library 232a may include cells in which conductive lines extend along immediately adjacent tracks and are coupled together by a conductive layer and/or a via disposed between supply lines.

Figure 1:
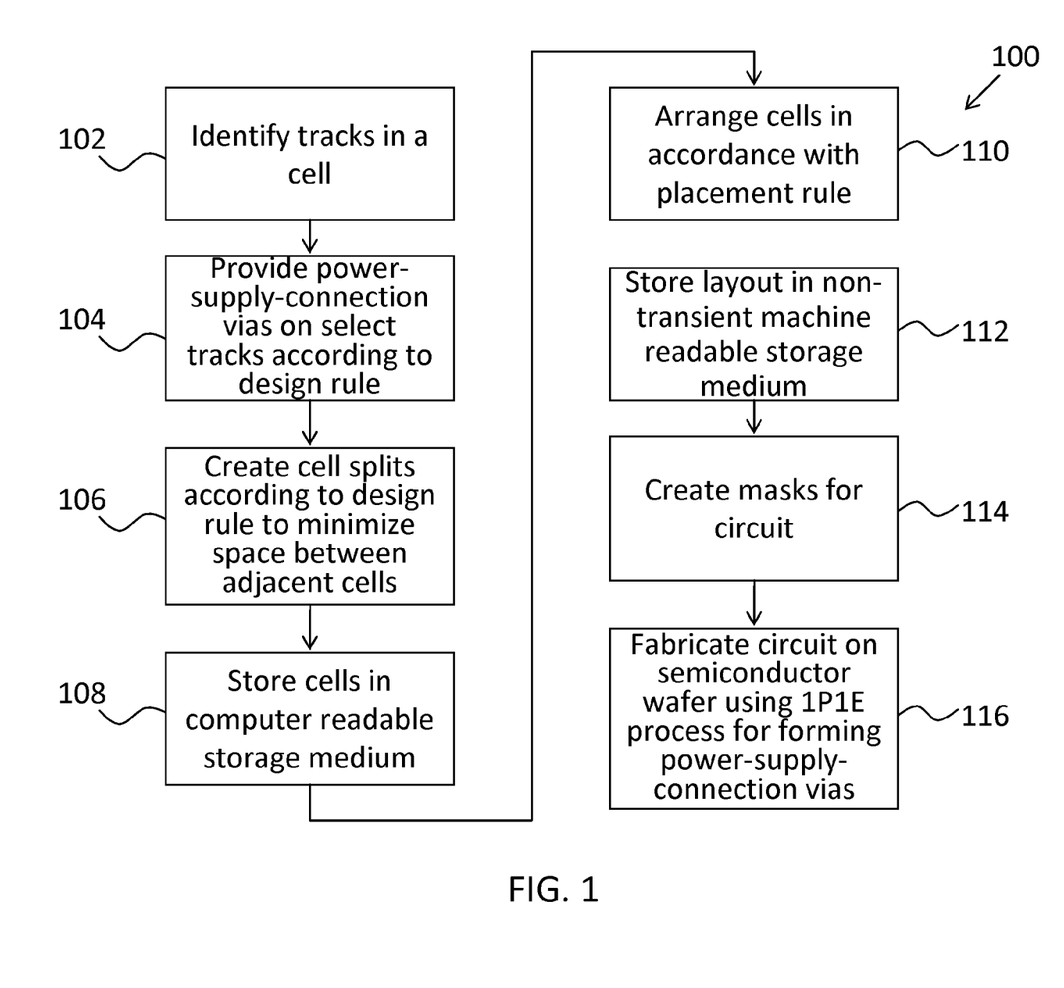
FIG. 1 is a flow diagram of one example of a method of fabricating a circuit on semiconductor wafer using improved cell constraints.
Figure 8:
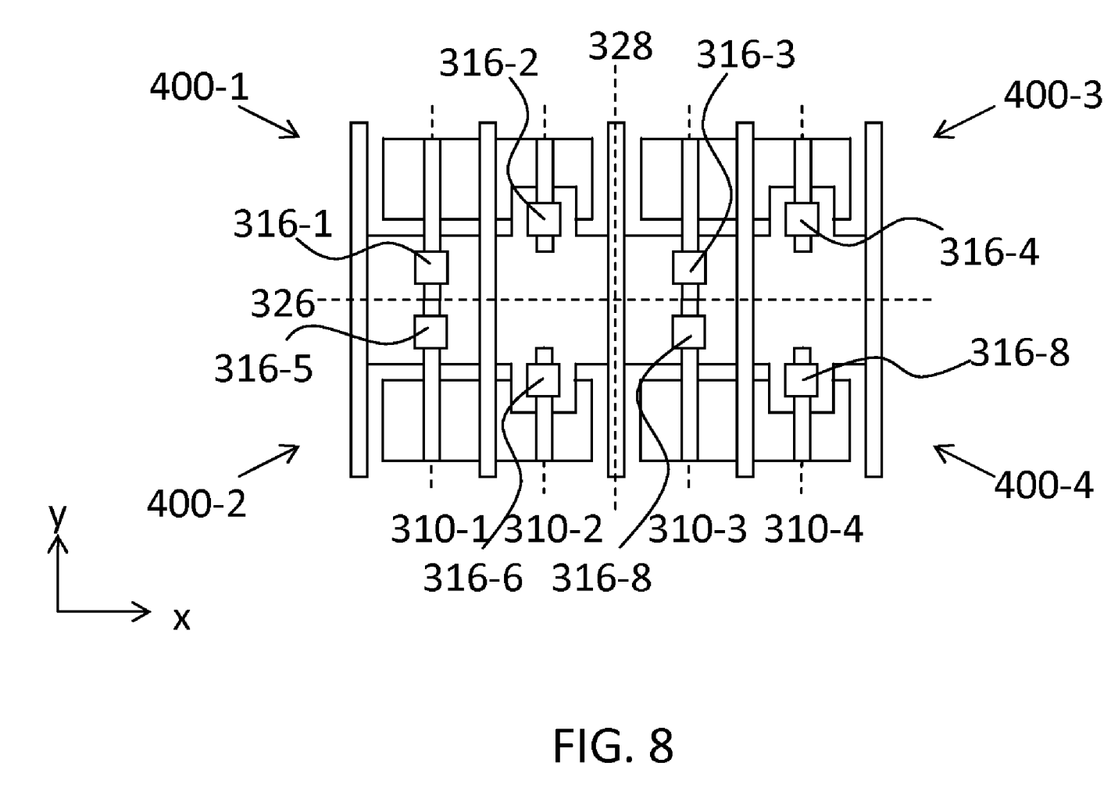
FIG. 8 illustrates one example of cells being placed relative to other cells.

At block 110 of FIG. 1, cells are placed and arranged on a photomask layout for an IC die, in accordance with a placement rule. In some embodiments, the placement rule may provide for spacing between adjacent cells that have vias disposed in a track along a cell boundary. For example, FIG. 8 illustrates a plurality of cells 400-1, 400-2, 400-3, and 400-4 placed in abutting relationship to each other on a semiconductor substrate. As shown in FIG. 8, cell 400-1 abuts cell 400-2 at line 326 and cell 400-3 at line 328, cell 400-2 abuts cell 400-1 at line 326 and cell 400-4 at line 328, cell 400-3 abuts cell 400-1 at line 328 and cell 400-4 at line 326, and cell 400-4 abuts cell 400-2 at line 328 and cell 400-3 at line 326.

Cells 400-1, 400-2, 400-3, and 400-4 are arranged such that corresponding even/odd tracks 310, which extend in a y-direction, for example, are collinearly aligned from one cell to another (i.e., odd tracks are aligned with odd tracks and even tracks are aligned with even tracks). Cells 400-1, 400-2, 400-3, and 400-4, which have been designed in accordance with one or more of the design rules described above, may be placed such that spacing between adjacent cells may be minimized while at the same time enabling the power-supply-connection vias to be formed using a 1P1E process. The cell designs that are placed and arranged on the substrate by EDA tool 200 may be retrieved from a non-transient computer readable storage medium 230, 240, such as from cell library 232a.

The layout of the cells may be stored as an electronic file 242 in one or more non-transient machine readable storage medium 230, 240 at block 112. As described above, examples of non-transient machine readable storage mediums 230, 240 include, but are not limited to, flash memories, RAMs, and/or a more persistent memory, such as a ROM. Examples of RAMs include, but are not limited to, SRAM or DRAM. A ROM may be implemented as PROM, EPROM, or EEPROM, to name few possibilities. The electronic file 242 may be a GDSII format file as will be understood by one skilled in the art.

At block 114 of FIG. 1, the GDSII file 242 is used by mask making equipment, such as an optical pattern generator, to generate a mask for the circuit including the improved cells. At block 114, router 220 may fabricate the circuit including the cells on a semiconductor wafer as will be understood by one skilled in the art. The power-supply-connection vias of the circuit may be fabricated using a 1P1E process.

In some embodiments, a method includes selecting a cell stored in a non-transient computer readable storage medium, arranging a plurality of the cells on a model of a semiconductor device, and creating a mask for the semiconductor device based on the model of the semiconductor device. The cell is designed according to a design rule in which a first power-supply-connection via satisfies a criterion from the group consisting of: i) the first power-supply-connection via is spaced apart from a second power-supply-connection via by a distance that is greater than a threshold distance such that the cell can be fabricated by a single-photolithography single-etch process, or ii) the first power-supply-connection via is coupled to first and second substantially parallel conductive lines that extend along directly adjacent tracks.

In some embodiments, a system includes a non-transient computer readable storage medium and a processor in communication with the non-transient computer readable storage medium. The non-transient computer readable storage medium includes data representing a cell for modeling and/or fabricating a semiconductor device. The cell is designed according to a design rule in which a first power-supply-connection via satisfies a criterion from the group consisting of: i) the first power-supply-connection via is spaced apart from a second via by a distance that is greater than a threshold distance such that the cell can be fabricated by a single-photolithography single-etch, or ii) the first power-supply-connection via is coupled to first and second substantially parallel conductive lines that extend along directly adjacent tracks. The processor is configured to select the cell, arrange a plurality of the cells on a model of a semiconductor device, and store the model of the semiconductor device including the plurality of cells in the non-transient computer readable storage medium.

In some embodiments, a non-transient computer readable storage medium is encoded with program code, wherein when the program code is executed by a processor, and the processor performs a method. The method includes selecting a cell for modeling and/or fabricating a semiconductor device, arranging a plurality of the cells on a model of a semiconductor device, and storing an electronic representation of the model. The cell is designed according to a design rule in which a first power-supply-connection via satisfies a criterion from the group consisting of: i) the first power-supply-connection via is spaced apart from a second power-supply-connection via by a distance that is greater than a threshold distance such that the cell can be fabricated by a single-photolithography single-etch, or ii) the first power-supply-connection via is coupled to first and second substantially parallel conductive lines that extend along directly adjacent tracks.

The methods and cells disclosed above advantageously enable a circuit to be fabricated on a semiconductor substrate using a single photolithography step and a single etch step. Forming the vias using a single mask in a 1P1E process reduces the number of processing steps for fabricating a circuit, which also reduces the processing time and production cost.

The methods described above may be at least partially embodied in the form of computer-implemented processes and apparatus for practicing those processes. The present methods may also be at least partially embodied in the form of computer program code embodied in tangible, non-transient machine-readable storage media, such as RAMs, ROMs, CD-ROMs, DVD-ROMs, BD-ROMs, hard disk drives, flash memories, or any other non-transient machine-readable storage medium, wherein, when the computer program code is loaded into and executed by a computer, the computer becomes an apparatus for practicing the method. The methods may be embodied at least partially in the form of computer program code, whether loaded into and/or executed by a computer, such that, when the computer program code is loaded into and executed by a computer, the computer becomes an apparatus for practicing the method. When implemented on a general-purpose processor, the computer program code segments configure the processor to create specific logic circuits. The methods may alternatively be at least partially embodied in a digital signal processor formed of application specific integrated circuits for performing a method according to the principles disclosed herein.

Although the disclosed systems and methods have been described in terms of exemplary embodiments, they are not limited thereto. Rather, the appended claims should be construed broadly, to include other variants and embodiments of the systems and methods, which may be made by those skilled in the art without departing from the scope and range of equivalents of the systems and methods. Delimiters used in the claims—such as 'a)' and 'i)'—should not be taken as imputing any order to the claims, but rather are provided only to serve as visual cues to add in the parsing of the claims and as identifiers in the event that a particular portion of the claim is to be later referenced.

What is claimed is:

1. A method, comprising:
    selecting a cell stored in a non-transient computer readable storage medium, the cell designed according to a design rule in which a first power-supply-connection via satisfies a criterion from the group consisting of:
        i) the first power-supply-connection via is spaced apart from a second power-supply-connection via by a distance that is greater than a threshold distance such that the cell can be fabricated by a single-photolithography single-etch process, or
        ii) the first power-supply-connection via is coupled to first and second substantially parallel conductive lines that extend along directly adjacent tracks;
    arranging a plurality of the cells on a model of a semiconductor device; and
    creating a mask for the semiconductor device based on the model of the semiconductor device.

2. The method of claim 1, further comprising:
    storing the model of the semiconductor device in the non-transient computer readable storage medium; and
    fabricating the semiconductor device using the mask, wherein the first power-supply-connection via is fabricated using a single-photolithography step and a single-etch step.

3. The method of claim 1, wherein the first power-supply-connection via is one of a plurality of power-supply-connection vias that are disposed along respective tracks, the plurality of power-supply-connection vias being aligned with each other in a first direction and being separated from one another by at least one track that does not include a power-supply-connection via.

4. The method of claim 1, wherein the first power-supply-connection via is one of a plurality of power-supply-connection vias that are disposed along respective tracks, the plurality of power-supply-connection vias are disposed along directly adjacent tracks and are shifted from one another in first and second directions.

5. The method of claim 4, wherein the first and second directions are x- and y-directions.

6. The method of claim 4, wherein the plurality of power-supply-connection vias are disposed over and are coupled to a first supply line.

7. The method of claim 1, wherein the first powers-supply-connection via is disposed over and is connected to a first supply line.

8. The method of claim 7, wherein a second via is disposed between first and second supply lines and extends in a substantially perpendicular direction to a direction in which the first and second conductive lines extend.

9. The method of claim 1, wherein the first power-supply-connection via is formed from a plurality of power-supply-connection vias such that the first power-supply-connection via has an area greater than an area of a single one of the power-supply-connection vias from which the first power-supply-connection via is formed.

10. The method of claim 1, wherein the first power-supply-connection via is coupled to the first and second substantially parallel conductive lines by a third conductive line that extends in a substantially perpendicular direction to a direction in which the first and second conductive lines extend.

11. The method of claim 1, wherein the first power-supply connection via is disposed over and coupled to a first supply line.

12. A system, comprising:
a non-transient computer readable storage medium including data representing a cell for modeling and/or fabricating a semiconductor device, the cell designed according to a design rule in which a first power-supply-connection via satisfies a criterion from the group consisting of:
  i) the first power-supply-connection via is spaced apart from a second power-supply-connection via by a distance that is greater than a threshold distance such that the cell can be fabricated by a single-photolithography single-etch, or
  ii) the first power-supply-connection via is coupled to first and second substantially parallel conductive lines that extend along directly adjacent tracks; and
a processor in communication with the non-transient computer readable storage medium, the processor configured to
  select the cell,
  arrange a plurality of the cells on a model of a semiconductor device, and
  store the model of the semiconductor device including the plurality of cells in the non-transient computer readable storage medium.

13. The system of claim 12, wherein the first power-supply-connection via is one of a plurality of power-supply-connection vias that are disposed along respective tracks, the plurality of power-supply-connection vias being aligned with each other in a first direction and being separated from one another by at least one track that does not include a power-supply-connection via.

14. The system of claim 12, wherein the first power-supply-connection via is one of a plurality of power-supply-connection vias that are disposed along respective tracks, the plurality of power-supply-connection vias are disposed along directly adjacent tracks and are shifted from one another in first and second directions.

15. The system of claim 12, wherein a second via is disposed between first and second supply lines and extends in a substantially perpendicular direction to a direction in which the first and second conductive lines extend.

16. The system of claim 12, wherein the first power-supply-connection via is coupled to the first and second substantially parallel conductive lines by a third conductive line that extends in a substantially perpendicular direction to a direction in which the first and second conductive lines extend.

17. A non-transient computer readable storage medium encoded with program code, wherein when the program code is executed by a processor, the processor performs a method, the method comprising:
selecting a cell for modeling and/or fabricating a semiconductor device, the cell designed according to a design rule in which a first power-supply-connection via satisfies a criterion from the group consisting of:
  i) the first power-supply-connection via is spaced apart from a second power-supply-connection via by a distance that is greater than a threshold distance such that the cell can be fabricated by a single-photolithography single-etch, or
  ii) the first power-supply-connection via is coupled to first and second substantially parallel conductive lines that extend along directly adjacent tracks; and
arranging a plurality of the cells on a model of a semiconductor device; and
storing an electronic representation of the model.

18. The non-transient computer readable storage medium of claim 17, wherein the first power-supply-connection via is one of a plurality of power-supply-connection vias that are disposed along respective tracks, the plurality of power-supply-connection vias being aligned with each other in a first direction and being separated from one another by at least one track that does not include a power-supply-connection via.

19. The non-transient computer readable storage medium of claim 17, wherein the first power-supply-connection via is one of a plurality of power-supply-connection vias that are disposed along respective tracks, the plurality of power-supply-connection vias are disposed along directly adjacent tracks and are shifted from one another in first and second directions.

20. The non-transient computer readable storage medium of claim 17, wherein a second via is disposed between first and second supply lines and extends in a substantially perpendicular direction to a direction in which the first and second conductive lines extend.

21. The non-transient computer readable storage medium of claim 17, wherein the first power-supply-connection via is coupled to the first and second substantially parallel conductive lines by a third conductive line that extends in a substantially perpendicular direction to a direction in which the first and second conductive lines extend.

* * * * *